United States Patent
Pham et al.

(10) Patent No.: US 7,772,104 B2
(45) Date of Patent: Aug. 10, 2010

(54) DYNAMIC PAD SIZE TO REDUCE SOLDER FATIGUE

(75) Inventors: Tim V. Pham, Austin, TX (US); Trent S. Uehling, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 504 days.

(21) Appl. No.: 11/701,651

(22) Filed: Feb. 2, 2007

(65) Prior Publication Data

US 2008/0185735 A1 Aug. 7, 2008

(51) Int. Cl.
*H01L 21/44* (2006.01)
*H01L 29/40* (2006.01)

(52) U.S. Cl. .................. 438/612; 438/108; 438/455; 438/613; 257/459; 257/777; 257/778; 257/779; 257/780; 257/E23.02; 257/E23.037; 257/E23.038; 257/737; 257/738; 257/786

(58) Field of Classification Search .......... 438/612, 438/108, 455, 613–617; 257/E23.02, E23.037, 257/E23.038, 459, 777–780, 737, 738, 786; 228/180, 22; 361/760–783; 716/3; 700/121
See application file for complete search history.

(56) References Cited

U.S. PATENT DOCUMENTS

| 5,404,047 | A | 4/1995 | Rostoker et al. |
| 5,880,987 | A | 3/1999 | Merritt |
| 6,268,568 | B1 * | 7/2001 | Kim .......................... 174/250 |
| 6,625,048 | B2 | 9/2003 | Adedifard |
| 6,678,948 | B1 * | 1/2004 | Benzler et al. ................ 29/840 |
| 2005/0012213 | A1 * | 1/2005 | Imaoka ....................... 257/737 |
| 2005/0269710 | A1 | 12/2005 | Lee et al. |
| 2006/0121718 | A1 | 6/2006 | Machida et al. |

OTHER PUBLICATIONS

PCT/US2008/051780 International Search Report and Written Opinion mailed Jun. 10, 2008.

* cited by examiner

*Primary Examiner*—Ha Tran T Nguyen
*Assistant Examiner*—Aaron A Dehne
(74) *Attorney, Agent, or Firm*—John A. Fortkort; Fortkort & Houston P.C.

(57) ABSTRACT

A semiconductor device is provided which comprises a substrate (501) having a plurality of bond pads (503) disposed thereon. Each bond pad has a major axis and a minor axis in a direction parallel to the substrate, and the ratio of the major axis to the minor axis increases with the distance of a bond pad from the center of the substrate.

18 Claims, 7 Drawing Sheets

DYNAMIC PAD SIZE TO REDUCE SOLDER FATIGUE

FIELD OF THE DISCLOSURE

The present invention relates generally to solder joints, and more particularly to bond pad designs which can be used to improve the integrity of solder joints.

BACKGROUND OF THE DISCLOSURE

Solder joints are used widely throughout the semiconductor arts as a convenient means for forming physical and/or electrical connections between device components. Such components may be, for example, a die and an IC packaging substrate, or an IC packaging substrate and a Printed Circuit Board (PCB). Typically, solder joint formation involves the mechanical or electrochemical deposition of solder onto a bond pad which is disposed on a surface of at least one of the components to be joined together, followed by solder reflow.

Figure 1:
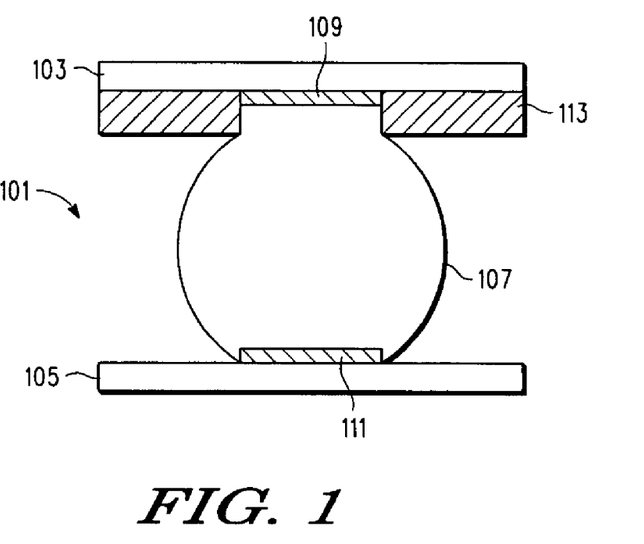
FIG. 1 is an illustration of a prior art solder joint.

FIG. 1 illustrates a typical solder joint 101 formed between a Ball Grid Array (BGA) substrate 103 and a die 105. Such a joint, which is common in flip chip packaging, comprises a portion of solder 107 that spans between a first bond pad 109 disposed on the BGA substrate 103 and a second bond pad 111 disposed on the die 105. In the particular device illustrated, the BGA substrate 103 is equipped with a solder mask 113 that defines the first bond pad 109. Hence, the solder joint formed to the BGA substrate 103 is solder mask-defined (SMD). By contrast, the solder joint formed to the die 105 is non-solder mask-defined (NSMD).

In a typical flip chip device, the die 105 and the BGA substrate 103 will have differing coefficients of thermal expansion. Consequently, varying amounts of stress and strain are applied to the solder joint as the device undergoes thermal cycling. Over time, these forces can cause the solder joint to crack, which may result in mechanical and/or electrical failure of the joint and/or the device.

The issue of solder joint failure and its effect in shortening the lifetime of semiconductor devices that contain solder joints has been recognized in the art for some time. Consequently, a variety of approaches have been proposed in the art to minimize solder joint failure, and to improve the reliability of semiconductor devices employing solder joints. Most of these approaches are undesirable, however, in that they significantly complicate the manufacturing process.

There is thus a need in the art for a simple method for forming solder joints that are more resistant to stress and strain, and that exhibit improved lifetimes. There is also a need in the art for devices made in accordance with such a method. These and other needs may be addressed with the devices and methodologies disclosed herein.

DETAILED DESCRIPTION

In one aspect, a method for making a semiconductor device is provided. In accordance with the method, a substrate is provided, and a plurality of bond pads are defined on the substrate. Each bond pad has a major axis and a minor axis in a direction parallel to the substrate, and the ratio of the major axis to the minor axis increases with the distance of a bond pad from the center of the substrate. The method may comprise forming a solder joint on each of said plurality of bond pads, wherein the dimension of the bond pad in any direction in the plane is proportional to the relative strain experienced by the solder joint in that direction.

In another aspect, a method for making a semiconductor device is provided which comprises (a) providing an initial data set relating to the dimensions and position of a bond pad on a semiconductor substrate; (b) determining an axis of expansion for the semiconductor substrate; (c) adjusting the dimensions of at least one of said bond pads as a function of the axis of expansion, thereby deriving an adjusted data set; and (d) using the adjusted data set to define a bond pad in a semiconductor device. In some embodiments, each of said plurality of bond pads is essentially elliptical in shape in a cross-section taken along a plane parallel to the substrate. In some embodiments, the cross-sectional areas of the plurality of bond pads along a plane parallel to the substrate are essentially equal. Also, in some embodiments, the data set is a solder mask data set.

In another aspect, a semiconductor device is provided which comprises a substrate having a plurality of bond pads disposed thereon. Each bond pad has a major axis and a minor axis in a direction parallel to the substrate, and the ratio of the major axis to the minor axis increases with the distance of a bond pad from the center of the substrate.

Figure 2:
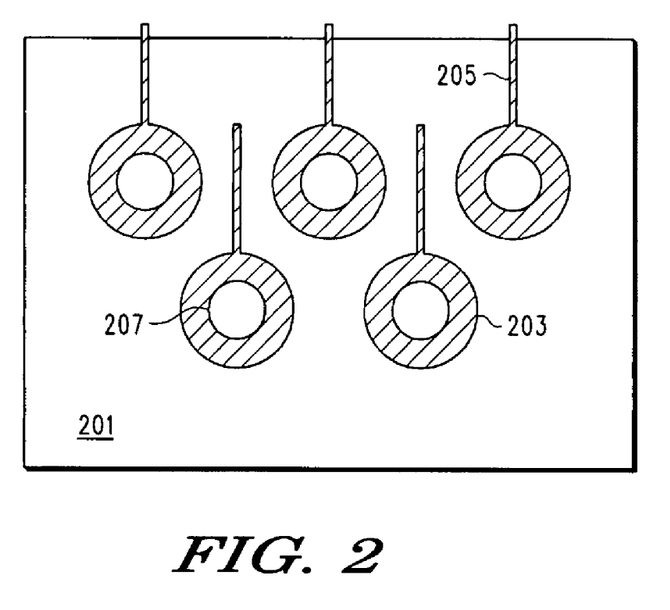
FIG. 2 is an illustration demonstrating routing issues in a BGA.

FIG. 2 illustrates the routing common in a BGA substrate which utilizes solder joints of the type depicted in FIG. 1. As seen therein, the BGA substrate 201 comprises a series of bond pads 203 which are in electrical contact with the circuitry of the BGA substrate 201 by way of a series of interconnects 205. Each bond pad 203 is equipped with a corresponding solder mask opening 207 which is of smaller diameter than the bond pad itself. The smaller diameter of the solder mask opening 207 is necessitated by the need to accommodate a certain degree of placement error between the bond pad 203 and the solder mask opening 207.

As FIG. 2 illustrates, the dimensions of the bond pads 203, and hence the solder mask openings 207, are constrained by the routing requirements in the BGA substrate 201. In particular, if the size of the bond pads 203 are increased without also increasing the overall size of the BGA substrate 201 (and hence the device incorporating the BGA substrate 201), the distance between adjacent bond pads 203 decreases, and routing of the interconnects 205 consequently becomes a more challenging proposition. If adjacent bond pads 203 are placed too closely together, normal placement error can result in shorting or cross-talk between the bond pads and any interconnect extending between them.

Figure 3:
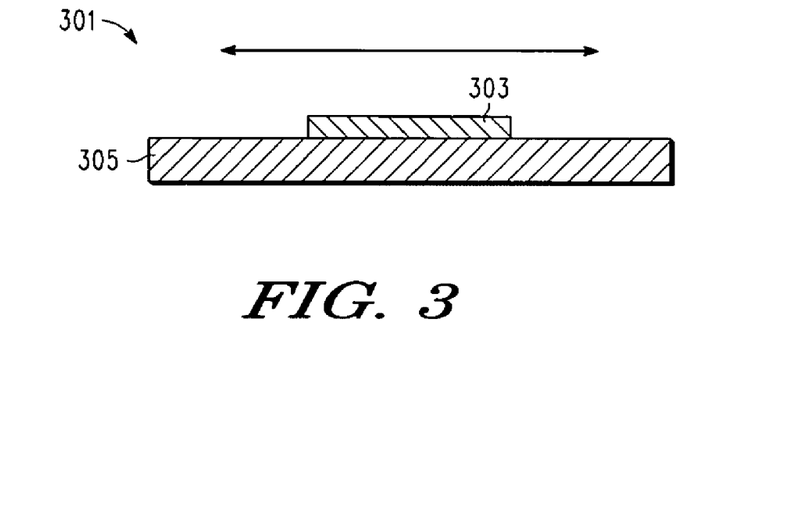
FIG. 3 is an illustration depicting stress in a packaged die.
Figure 4:
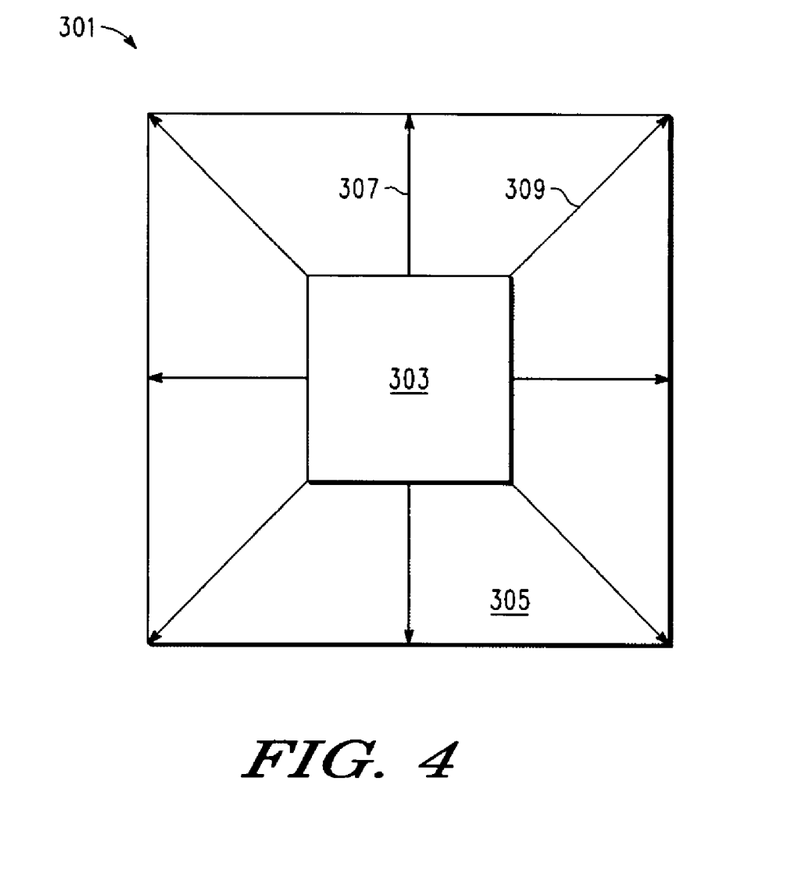
FIG. 4 is an illustration depicting stress in a packaged die.

FIGS. 3-4 illustrate the directionality of the CTE stress associated with a typical flip-chip package 301 comprising a die 303, a BGA substrate 305, and a BGA (not shown) which is centered on the die. The CTE stress differential $\Delta_{CTE}$ at a given point in the flip-chip package 301 (and in particular, at a given point in the BGA thereof) is given essentially by EQUATION 1:

$$\Delta_{CTE} = \Delta T^*(CTE_{substrate} - CTE_{die}) \quad \text{(EQUATION 1)}$$

where $\Delta T$ is the temperature range to which the device is exposed;

$CTE_{substrate}$ is the coefficient of thermal expansion of the substrate; and $CTE_{die}$ is the coefficient of thermal expansion of the die.

The stretch distance $d_s$ is given by EQUATION 2:

$$d_s = \Delta_{CTE} * L \quad \text{(EQUATION 2)}$$

where

L is the distance from the neutral point (typically the center of the BGA). It is thus seen from the foregoing that, in a typical rectangular BGA utilized in a flip-chip package, CTE stress increases proportionally with increasing distance from the center of the BGA 301. It will thus be appreciated that the CTE stress will be at a maximum along the radial axes in the BGA, since the solder joints at those points will be the farthest distance from the center of the BGA than any other solder joints in the same row or column.

It has been found that, in flip chip packages 301 of the type depicted in FIGS. 3-4, solder joint failure occurs most commonly along the portion of the solder joint near the BGA substrate 305, where the solder joint is narrowest and is solder mask defined. Moreover, it has been found that solder failure is not randomly distributed among all of the solder joints in the ball grid array (BGA). Rather, solder joint failure is found to occur more frequently as one moves away from the center of the BGA, and is especially prevalent along the radial axes of the BGA where CTE stress is at a maximum. A more random distribution of solder joint failure would be preferable, since then the failed joints would be more evenly distributed across the BGA and could be accommodated through suitable redundancy.

Without wishing to be bound by theory, it is believed that this distribution of solder joint failure is directly related to the relative distribution of CTE stress. Many prior art methods aimed at reducing solder joint failure ignore this factor, and treat all solder joints within the BGA the same. Examples of this type of approach include methods which aim to reduce solder joint fatigue by utilizing convex bond pads, thereby increasing the surface area of the bond pad/solder joint interface. In theory, such an approach moves the region of maximum CTE stress closer to the center of the solder joint, where the solder joint is thicker and, therefore, presumably capable of accommodating greater CTE stress levels. However, while such methods may increase the relative lifetimes of individual solder joints, they result in the same non-random pattern of solder joint failure as noted above.

Another possible approach for reducing solder joint failure would be to simply increase the dimensions of the solder joint. However, doing so is not practical in most applications, because this would require a corresponding increase in the dimensions of the bond pads, which would give rise to routing issues and/or increase the overall size of the device. Moreover, as with the above noted method, while this approach may result in longer individual solder joint lifetimes, it would not give rise to a random pattern of solder joint failure.

It has now been found that the above noted needs in the art may be met through the provision of bond pads which are elongated in the direction of greatest thermal expansion and greatest CTE stress. This may be accomplished, for example, by designing the bond pads such that each bond pad has a major axis and a minor axis (in a direction parallel to the substrate), and such that the ratio of the major axis to the minor axis increases with the distance of a bond pad from the center of the substrate. Preferably, the major axis of each bond pad is aligned with the major axis of thermal expansion (in a direction parallel to the substrate) of a solder joint formed on the pad. Of course, it will be appreciated that other methods of modifying the dimensions of bond pads as a function of local CTE stress levels may also be utilized to a similar end.

In the resulting device, the maximum dimension of any bond pad and/or solder mask opening is commensurate with, and is preferably proportional to, the relative CTE stress experienced by the solder joint at that location. Since solder joint failures occur most frequently near the bond pad/solder joint interface, this approach has the effect of increasing the dimensions of the bond pad and/or the corresponding solder mask opening, and hence the size and strength of the solder joint, in the direction most needed. On the other hand, since the overall size of the bond pad need not increase significantly, if at all (the dimensions of the bond pad may be reduced in other directions where CTE stress is not as great), this resistance to solder fatigue may be obtained with minimal impact on routability in the device.

Figure 5:
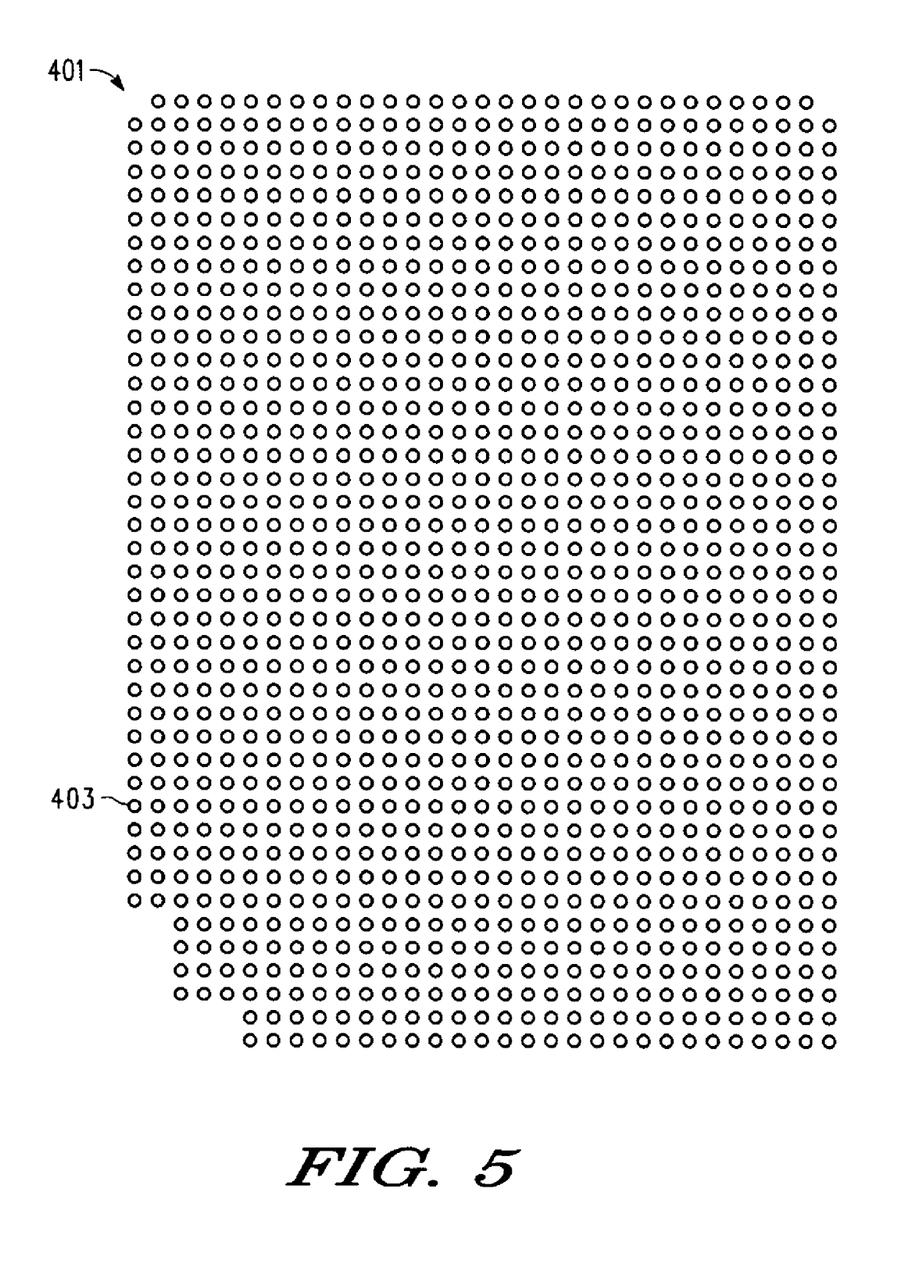
FIG. 5 is an illustration of bond pads in a BGA.
Figure 6:
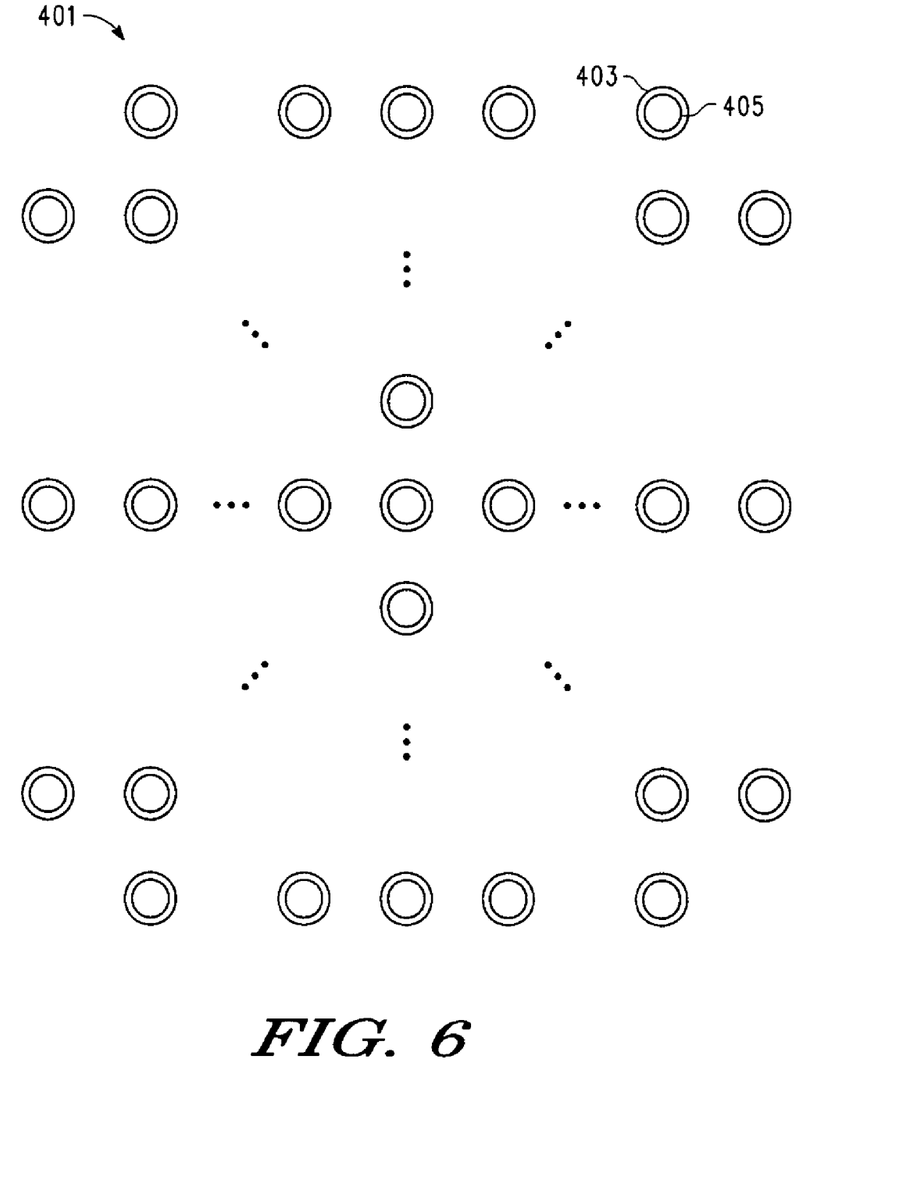
FIG. 6 is an illustration depicting bond pads in the center and extremes of the BGA of FIG. 5.

The methodology described herein may be better understood with reference to FIGS. 5-9. FIG. 5 depicts the arrangement of bond pads 403 in a conventional ball grid array (BGA) 401. FIG. 6 shows the bond pads 403 and associated solder mask openings 405 in greater detail in locations at the center and extrema of the BGA 401. Notably, the bond pads 403 and their associated solder mask openings 405 are of the same respective dimensions at all locations throughout the BGA 401.

Figure 7:
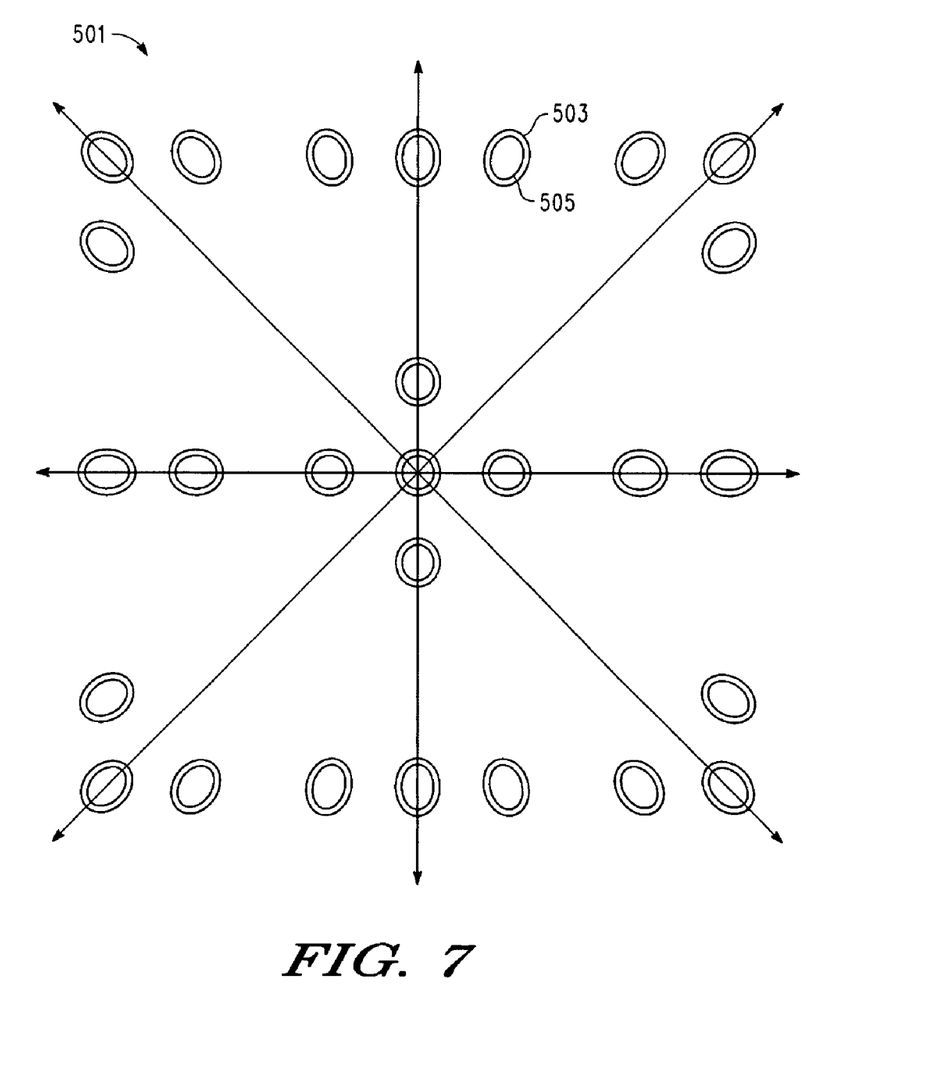
FIG. 7 is an illustration depicting bond pads in the center and extremes of the BGA of FIG. 5 which have been modified in accordance with the teachings herein.

FIG. 7 illustrates how the bond pads in the BGA of FIGS. 5-6 may be modified in accordance with the teachings herein to improve their resistance to CTE stress. As seen therein, the bond pads 503 of the BGA 501 depicted therein, and their associated solder mask openings 505, have been elongated along axes extending radially from the center of the BGA 501, and proportional to the distance of the bond pad 503 from the center of the BGA 501. Consequently, the dimensions of solder joints formed to these bond pads will be greatest along the axes of greatest CTE differential stress.

It will be appreciated from the foregoing that the methodology disclosed herein may be utilized to effectively allocate solder joint thickness where it is most needed within a BGA to accommodate CTE stress differentials. Consequently, solder joint failure is less likely to occur and, when it does occur, will tend to be randomly distributed across the BGA, where it may be accommodated by suitable redundancies typically designed into the BGA.

Figure 8:
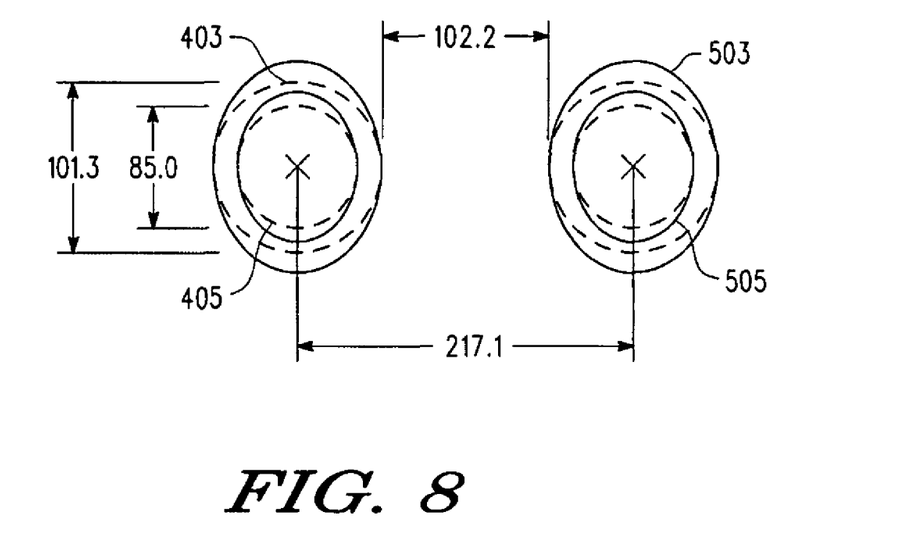
FIG. 8 is an illustration comparing bond pads in the BGA of FIG. 7 to those in the BGA of FIG. 6.
Figure 9:
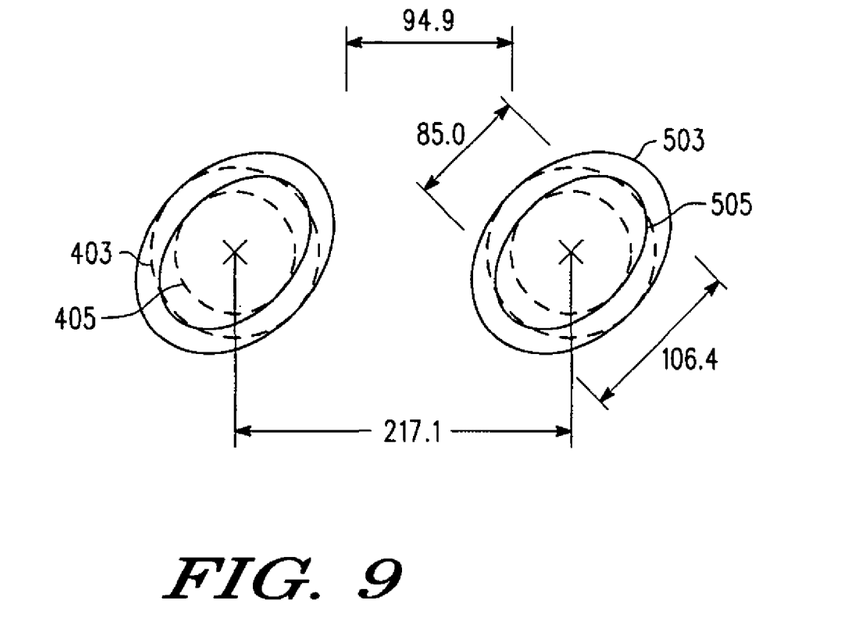
FIG. 9 is an illustration comparing bond pads in the BGA of FIG. 7 to those in the BGA of FIG. 6.

FIGS. 8-9 illustrate one particular, non-limiting example of the dimensional changes of particular bond pads within the BGA 501 of FIG. 7. FIG. 8 illustrates two adjacent bond pads 503 (and their associated solder mask openings 505) taken from the top middle portion of the BGA 501 depicted in FIG. 7, while FIG. 9 illustrates two adjacent bond pads 503 (and their associated solder mask openings 505) taken from the top right portion of the BGA 501 depicted in FIG. 7. In each case, the original dimensions of the bond pad 403 and respective solder mask openings 405 are indicated with dashed lines for comparison.

In the case of the bond pads depicted in FIG. 8, the bond pads have been elongated in the vertical direction by 16.3 microns, thus giving rise to an increase in bond pad surface area of 19% (from 5674 $\mu m^2$ to 6761 $\mu m^2$). However, the space between the pads which is available for routing has been unaffected by this modification, and remains at 102.2 microns. It will be appreciated that similar results (with respect to routing) will be obtained along any axis parallel to a side of the BGA.

In the case of the bond pads depicted in FIG. 9, the bond pads have been elongated along a longitudinal axis by 21.5 microns, thus giving rise to an increase in bond pad surface area of 25% (from 5674 $\mu m^2$ to 7100 $\mu m^2$). The space between the bond pads which is available for routing has been reduced slightly by this modification by 7.2 microns (a reduction of about 7%). However, due to their placement on the BGA, these bond pads represent the maximum reduction in routing attendant to the methodology in this particular embodiment. Hence, over most of the BGA, the average reduction in routing space would be expected to be significantly less than this amount.

Figure 10:
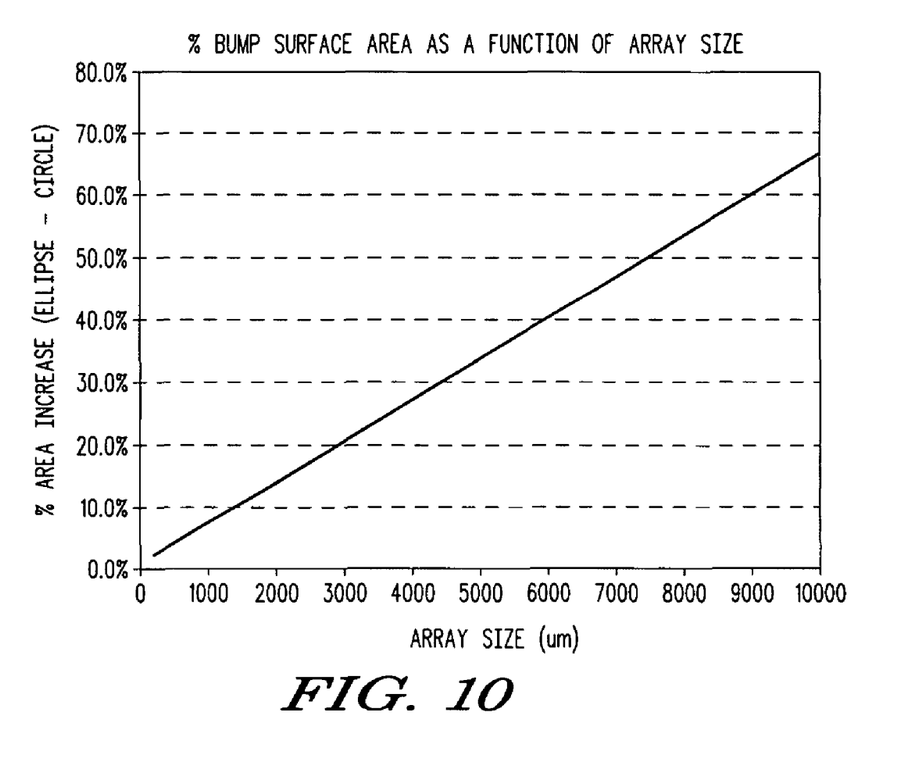
FIG. 10 is a graph of the % increase in area of a solder bump as a function of array size.

FIG. 10 is a graph of the % increase in bond pad area as a function of array size when one replaces conventional circular bond pads within the array with elliptical bond pads which have been elongated in the manner depicted in FIG. 7. As seen therein, the % increase in bond pad area increases essentially linearly with array size. Compared with the above noted modest decrease in routing area, this graph demonstrates that the methodology taught herein may be utilized to significantly increase solder joint dimensions along axes where CTE stress is greatest (as indicated by the significant increase in % area), with only minimal attendant decreases in routing area. This, in turn, may result in increased solder joint lifetimes and improve product durability.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a substrate;
   creating a plurality of bond pads on said substrate; and
   forming a solder joint on each of said plurality of bond pads;
   wherein each bond pad and each solder joint formed on the bond pad has a major axis and a minor axis in a plane parallel to the substrate, wherein the ratio of the major axis to the minor axis increases with the distance of a bond pad from the center of the substrate, and wherein the dimension of the bond pad in any direction in the plane is proportional to the relative CTE stress experienced by the solder joint in that direction.

2. The method of claim 1, wherein the major axis of each bond pad is essentially parallel to the major axis of thermal expansion of the solder joint in a direction parallel to the substrate.

3. The method of claim 1, wherein the substrate has a layer of solder resist disposed thereon, and wherein the plurality of bond pads is formed by a process that includes selectively removing portions of the solder resist.

4. The method of claim 1, wherein the substrate is a packaging substrate, and wherein each solder joint is attached on a first end to one of said plurality of bond pads, and is attached on a second end to a semiconductor die.

5. The method of claim 1, wherein the ratio of the major axis to the minor axis of each of said plurality of bond pads is essentially proportional to the distance of the bond pad from the center of the substrate.

6. The method of claim 5, wherein the substrate has a die disposed thereon, and wherein the ratio $d_s$ of the major axis to the minor axis of any of said plurality of bond pads is essentially given by the equation $$d_s = \Delta_{CTE} * L$$

where L is the distance from the center of the substrate, and wherein $\Delta_{CTE}$ is the CTE stress differential between the die and the substrate.

7. The method of claim 6, where $\Delta_{CTE}$ is given by the equation $$\Delta_{CTE} = \Delta T * (CTE_{substrate} - CTE_{die})$$

wherein
   $\Delta T$ is the temperature range to which the device is exposed;
   $CTE_{substrate}$ is the coefficient of thermal expansion of the substrate; and
   $\Delta CTE_{die}$ is the coefficient of thermal expansion of the die.

8. The method of claim 1, wherein each of said plurality of bond pads is essentially elliptical in shape in a cross-section taken along a plane parallel to the substrate.

9. A method for making a semiconductor device, comprising:
   providing an initial data set relating to the dimensions and position of a bond pad on a semiconductor substrate;
   determining an axis of expansion for the semiconductor substrate;
   adjusting the dimensions of at least one of said bond pads and of a solder joint formed on the at least one bond pad as a function of the axis of expansion, thereby deriving an adjusted data set; and
   using the adjusted data set to define a bond pad in a semiconductor device.

10. The method of claim 9, wherein each of said plurality of bond pads is essentially elliptical in shape in a cross-section taken along a plane parallel to the substrate.

11. The method of claim 9, wherein the cross-sectional areas of the plurality of bond pads along a plane parallel to the substrate are essentially equal.

12. The method of claim 9, wherein the data set is a solder mask data set.

13. The method of claim 9, where the axis of expansion is an axis of thermal expansion.

14. The method of claim 9, wherein the major axis of each bond pad is essentially parallel to the major axis of thermal expansion of the solder joint in a direction parallel to the substrate.

15. The method of claim 14, wherein the substrate has a layer of solder resist disposed thereon, and wherein the plurality of bond pads is formed by a process that includes selectively removing portions of the solder resist.

16. The method of claim 14, wherein the ratio of the major axis to the minor axis of each of said plurality of bond pads is essentially proportional to the distance of the bond pad from the center of the substrate.

17. The method of claim 1, and wherein the dimensions of each solder joint along the major and minor axes is determined by an opening in the solder mask.

18. The method of claim 15, wherein the opening in the solder mask over a given bond pad has dimensions along the major and minor axes which are proportional to the dimensions of the bond pad along those axes.

* * * * *